(12) United States Patent
Naik et al.

(10) Patent No.: US 6,245,662 B1
(45) Date of Patent: Jun. 12, 2001

(54) METHOD OF PRODUCING AN INTERCONNECT STRUCTURE FOR AN INTEGRATED CIRCUIT

(75) Inventors: Mehul Naik, San Jose; Samuel Broydo, Los Altos Hills, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/122,080

(22) Filed: Jul. 23, 1998

(51) Int. Cl.⁷ .............................................. H01L 21/4763
(52) U.S. Cl. .................... 438/622; 438/639; 438/637; 438/638; 438/641
(58) Field of Search .................. 438/622, 634, 438/637, 638, 641

(56) References Cited

U.S. PATENT DOCUMENTS

| | | | |
|---|---|---|---|
| 4,962,058 | * 10/1990 | Cronin et al. | 437/187 |
| 5,013,400 | * 5/1991 | Kurasaki et al. | 156/643 |
| 5,262,354 | 11/1993 | Cote et al. | 438/645 |
| 5,371,042 | 12/1994 | Ong | 438/653 |
| 5,439,780 | 8/1995 | Joshi et al. | 430/296 |
| 5,443,995 | 8/1995 | Nulman | 438/654 |
| 5,578,523 | * 11/1996 | Fiordalice et al. | 437/190 |
| 5,614,765 | 3/1997 | Avanzino et al. | 257/774 |
| 5,635,423 | 6/1997 | Huang et al. | 438/638 |
| 5,693,568 | 12/1997 | Liu et al. | 437/195 |
| 5,702,982 | 12/1997 | Lee et al. | 437/195 |
| 5,877,076 | * 3/1999 | Dai | 438/597 |
| 5,882,996 | * 3/1999 | Dai | 438/597 |
| 5,904,565 | * 5/1999 | Nguyen et al. | 438/687 |
| 5,920,790 | * 7/1999 | Wetzel et al. | 438/618 |

FOREIGN PATENT DOCUMENTS

| | | | |
|---|---|---|---|
| 0 435 187 A2 | 7/1991 | (EP) | H01L/21/28 |
| 0 843 348 A2 | 5/1998 | (EP) | H01L/21/316 |
| 97/10612 | 3/1997 | (WO) | H01L/21/033 |

* cited by examiner

*Primary Examiner*—Michael Trinh
*Assistant Examiner*—Maria Guerrero
(74) *Attorney, Agent, or Firm*—Thomason, Moser & Patterson

(57) ABSTRACT

A dual damascene technique that forms a complete via in a single step. Specifically, the method deposits a first insulator layer upon a substrate, an etch stop layer over the first insulator layer, and a second insulator layer atop the etch stop layer. A via mask is then formed by applying a photoresist which is developed and patterned according to the locations of the dimensions of the ultimate via or vias. Thereafter, the first insulator layer, the etch stop layer and the second insulator layer may be etched in a single step, for example, using a reactive ion etch. The hole that is formed through these three layers has the diameter of the ultimate via. Thereafter, a trench is masked and etched into the second insulator layer. The trench etch is stopped by the etch stop layer. The via and trench are metallized to form an interconnect structure. The technique can be repeated to create a multi-level interconnect structure.

19 Claims, 6 Drawing Sheets

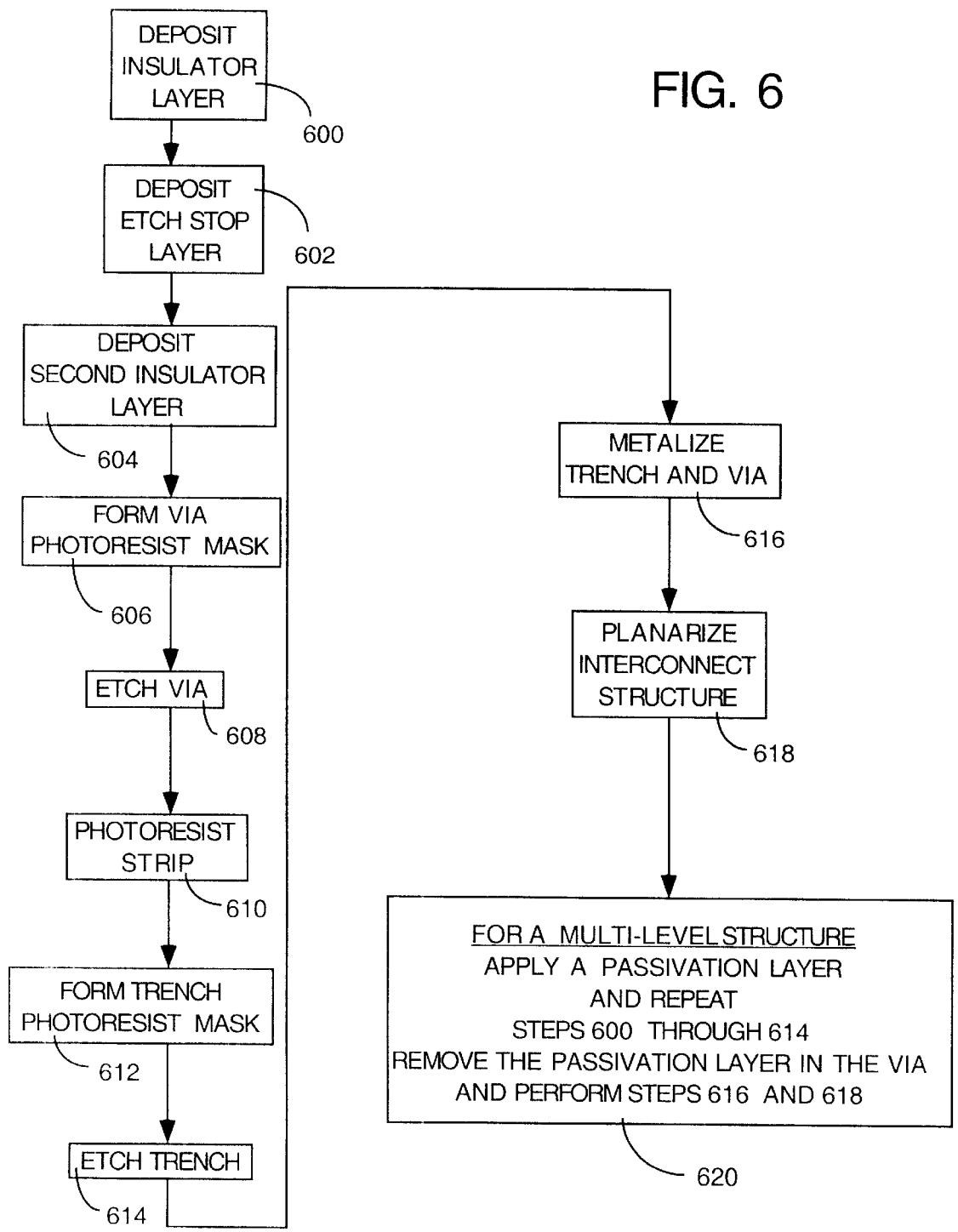

METHOD OF PRODUCING AN INTERCONNECT STRUCTURE FOR AN INTEGRATED CIRCUIT

BACKGROUND OF THE DISCLOSURE

1. Field of the Invention

The invention relates to metallization and interconnect fabrication processes for fabricating integrated circuits and, more particularly, the invention relates to an improved dual damascene process for fabricating an interconnect structure within an integrated circuit.

2. Description of the Background Art

Damascene techniques have been developed in response to the stringent requirements on metal etch, dielectric gap fill and planarization that are used in modern integrated circuit fabrication. The main advantage of using a damascene technique is the elimination of metal etch and insulator gap fill steps within the process for fabricating interconnect structures. The elimination of metal etch steps becomes important as the industry moves from aluminum to copper metallization materials, since etching copper is difficult.

There are two kinds of damascene processes: single and dual. In a single damascene process for fabricating interconnect structures, as depicted in FIGS. 1A–1G, a first insulator 102 is deposited upon a substrate 100 and a via 104 is etched into the insulator 102 using, for example, a reactive ion etch (RIE) process. Then, the via 104 is filled with a metal layer 106 by metal deposition. The plug is planarized by, for example, chemical mechanical polishing (CMP) to form a "plug" 108. Thereafter, a second insulator 110 is deposited atop the first insulator 102 and one or more trenches 112 are etched through the second insulator layer 110 using an RIE process. The trench 112 is then filled with a metal layer 114 using a metal deposition process to form an interconnection line that is then planarized by CMP. In this manner, a plurality of interconnect lines 116 are formed to conductively connect the plugs 108 to one another.

In a conventional dual damascene approach to forming interconnections, the vias and trenches are simultaneously filled with metal, thereby requiring fewer metallization and planarization steps in the fabrication process. Since both the line and via are simultaneously metallized in a dual damascene process, such structures eliminate any interface between the metal plug and the metal line.

More specifically, a dual damascene technique, as illustrated in FIGS. 2A–12E, deposits upon a substrate 200 an insulator 202 having a thickness that is equal to the via plus the trench depth. A mask 204 in the form of a via mask is deposited over the insulator 202 and one or more vias 206 are etched into the insulator. The mask is then removed, and a second mask 204 is formed, this being the trench mask. Thereafter, one or more trenches 210 are etched to a depth that approximately reaches the middle of the insulator 202. As such, the trench depth is produced using a blind etch stop, i.e., the etch is stopped after a predefined period of time. Such a process is notoriously inaccurate for producing a repeatable and well-defined depth to the trench. Any undeveloped photoresist 212 from the second mask located within the via opening protects the via bottom from the etchant. The resist strip process used to remove the second mask has to be controlled to remove all of the resist from the via as well. Thereafter, both the trench 210 and the via 206 are metallized with a metal layer 214 in a single step and the structure is then planarized to form a trench and plug interconnect structure.

U.S. Pat. No. 5,635,423 discloses an improved dual damascene process. In this process, a first insulator is deposited to the desired thickness of a via. Thereafter, a thin etch stop layer is deposited over the first insulator layer and a second insulator having a thickness that is approximately equal to the desired trench depth is deposited on top of the etch stop layer. A photoresist mask (a via mask) is then formed atop the second insulator. Thereafter, an etch process is used to etch holes through the second insulator having a size equal to the via diameter. The etch is stopped on the etch stop layer. The via mask is then removed, and a trench mask is formed on top of the second insulator. Care must be taken that the resist is developed completely to the bottom of the via hole that was previously formed or the etch stop layer and first insulator will not be properly etched in subsequent process steps to form the via. Using the trench mask, trenches are etched in the second insulator and, simultaneously, the via is etched through the etch stop and the first insulator. Once the trench and via are formed, the structure can then be metallized to form the interconnects.

In this process, if any photoresist remains in the via in the second insulator, then the via will not be formed, or improperly formed, in the first insulator layer. Also, if the trench edge is crossing the via, a partial amount of photoresist will be left in the via, then the via will not be formed completely and will be distorted. Such an incomplete via will generally result in an interconnection failure.

Therefore, a need exists in the art for a dual damascene process that forms an interconnect structure without the detrimental need for complete removal of the photoresist used to define the via, even when the trench edge is crossing the via.

SUMMARY OF THE INVENTION

The disadvantages associated with the prior art techniques used for forming metal interconnections are overcome by the present invention of a dual damascene technique that forms a complete via in a single step. Specifically, the method of the present invention deposits a first insulator layer upon a substrate, an etch stop layer over the first insulator layer, and a second insulator layer atop the etch stop layer. A via mask is then formed, for example, by a spin-on chemical vapor deposition or (CVD) photoresist which is developed and patterned according to the locations of the dimensions of the ultimate via or vias. Thereafter, the first insulator layer, the etch stop layer and the second insulator layer are etched in a single step, for example, using a reactive ion etch process. The hole that is formed through these three layers has the diameter of the ultimate via. Thereafter, a photoresist strip process is performed to remove all of the photoresist used to form the via mask. A second mask, the trench mask, is then formed, for example, by spinning on a photoresist, developing and patterning that photoresist. The pattern defines the location and dimensions of the trench or trenches to be formed in the second insulator layer. During the developing of the trench mask, the resist may not be developed completely from the via, i.e., some photoresist purposefully remains within the via. Thereafter, the trench is etched into the second insulator layer using reactive ion etch process. The undeveloped photoresist that may remain in the via after the trench mask is formed protects the via during the trench etch process from becoming etched even further. The stop layer creates a wide process window within which to etch the trench. As such, using the process of the present invention, it is not important that the trench edge might cross the via and that photoresist is left in a via, since the via is completely formed before the trench lithography. Once the trench is formed, the trench mask is removed and both the trench and via are metallized simultaneously. Thereafter, the metallization is planarized by chemical mechanical polishing (CMP) or an etch-back process.

To continue the interconnect structure toward creating a multi-level structure, a passivation layer is deposited atop the structure formed above. Then the process is repeated to fabricate another dual damascene structure. Prior to metallization of the upper structure, the passivation layer is etched to open a contact via to the underlying structure. The upper structure is then metallized and planarized to form a second level of the multi-level interconnect structure. The process can be repeated again and again to add additional levels.

The process for creating a dual damascene interconnect structure in accordance with the present invention may be implemented by a computer program executing on a general purpose computer. The computer controls the various process steps to create the structure(s) described above.

BRIEF DESCRIPTION OF THE DRAWINGS

The teachings of the present invention can be readily understood by considering the following detailed description in conjunction with the accompanying drawings, in which:

FIG. 6 depicts a flow diagram of a software program that is executed by the computer of FIG. 5 to control the semiconductor wafer processing system.

To facilitate understanding, identical reference numerals have been used, where possible, to designate identical elements that are common to the figures.

DETAILED DESCRIPTION

Figure 1A:
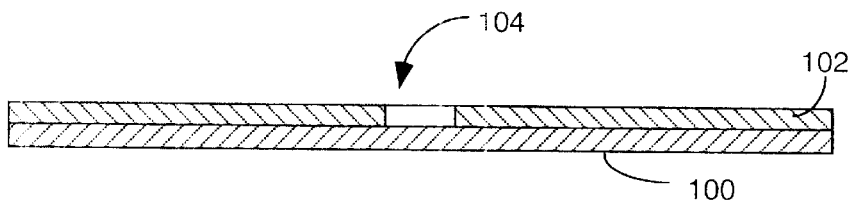
FIGS. 1A–1G depict the sequence of process steps of a prior art single damascene process.
Figure 1B:
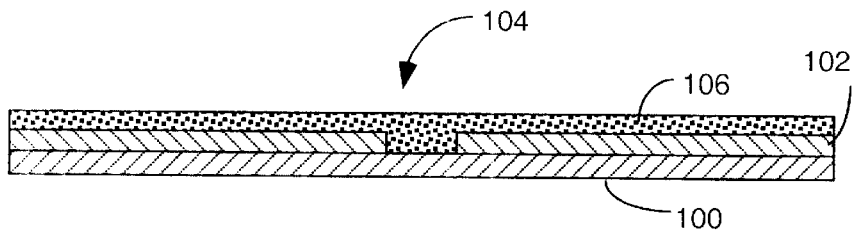
Figure 1C:
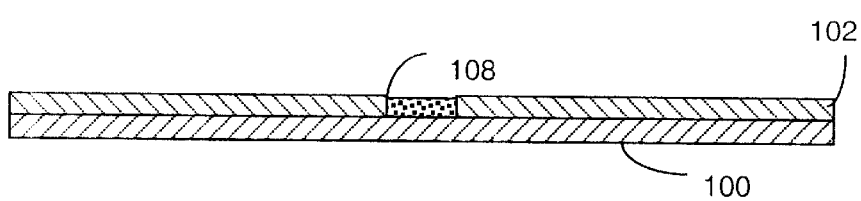
Figure 1D:
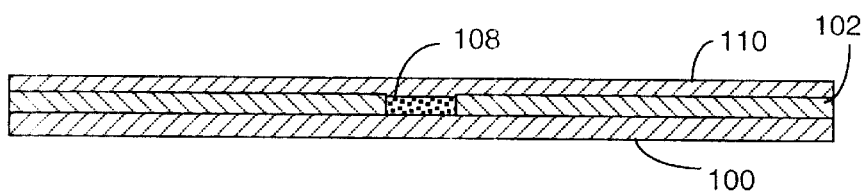
Figure 1E:
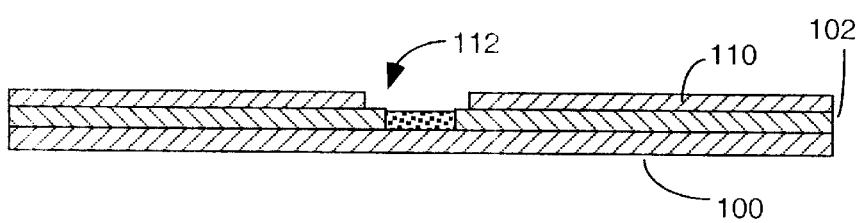
Figure 1F:
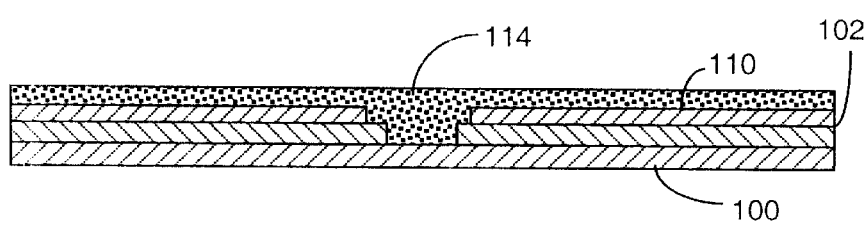
Figure 1G:
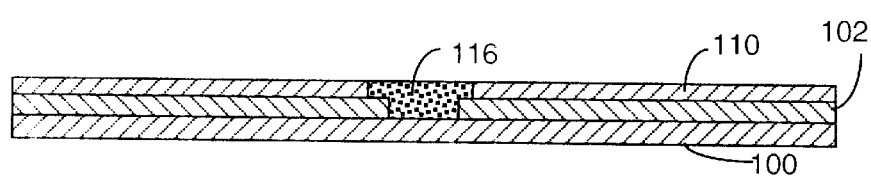
Figures 2A, 2B, 2C, 2D, 2E:
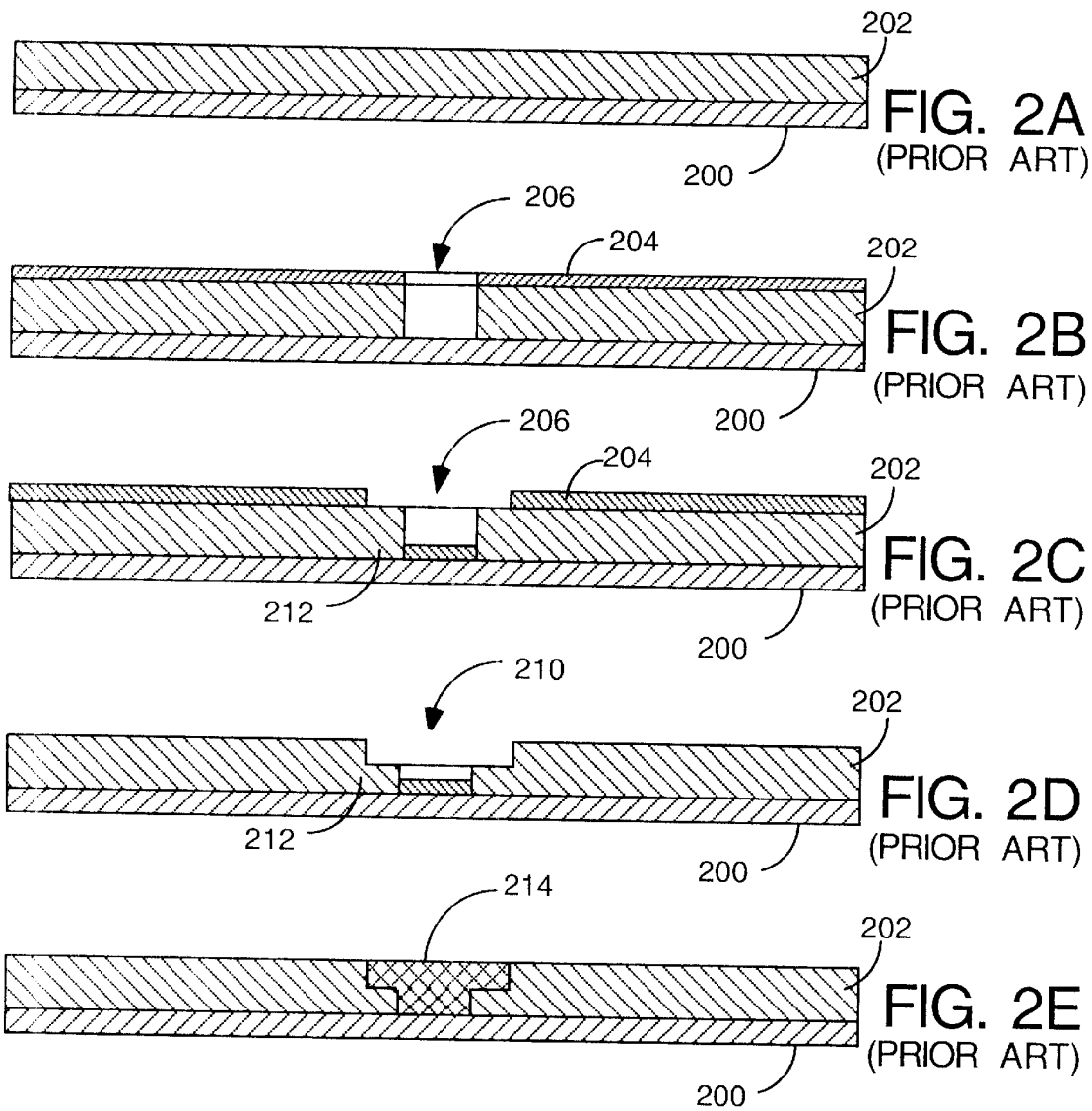
FIGS. 2A–2E depict the sequence of process steps of a prior art dual damascene process.
Figure 3A:
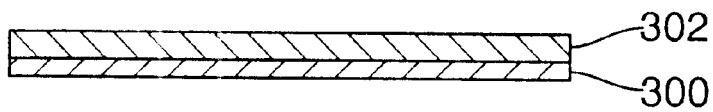
FIGS. 3A–3H depict the sequence of process steps of a dual damascene process in accordance with the present invention.
Figure 3B:
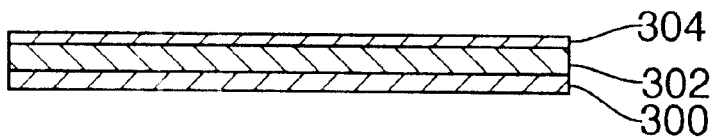
Figure 3C:
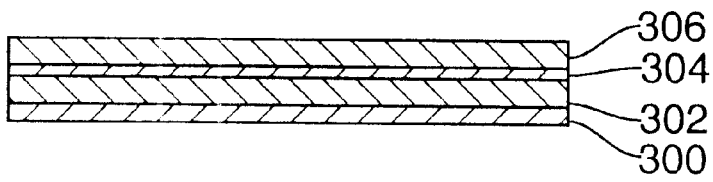

FIGS. 3A–3H depict the process steps of a dual damascene process of the present invention. FIG. 3A depicts a first insulator layer 302 having been deposited upon a substrate 300 to a thickness of approximately equal to the desired depth of a via. The first insulator layer 302 is generally any insulator that is to be used within the interconnect structure, e.g., silicon dioxide ($SiO_2$) or a low dielectric constant (k) material such as fluorinated polyimide, fluorinated silicate glass (FSG), amorphous-fluorinated carbon (a-C:F), a class of materials known as Polyarylethers (commonly known as PAE2.0, PAE2.3 and FLARE 2.0), SILK, DVS-BCB, aerogels, HSQ, MSSQ, Parylene and its co-polymers, Parylene-AF4, any low k material derived from silicon oxide (e.g., Black Diamond), FlowFill, and the like. FIG. 1B depicts the deposition of an etch stop layer 304 deposited atop the first insulator layer 302. The etch stop layer 304 is fabricated of, for example, silicon nitride if the insulator is an oxide, oxide-based or an organic low K material. In general, the etch stop material is any dielectric that is difficult to etch with the chemistry used to etch the insulator layer. For example, amorphous carbon can be used as an etch stop when the insulator is oxide-based, SiC or combination of SiC/SiN or any layered etch stop such that the two layer thickness can be optimized for a particular insulator. FIG. 3C depicts the deposition of a second insulator layer 306 having been deposited on top of the etch stop layer 304. The second insulator layer 306 again being any insulator that is to be used with the interconnect structure, e.g., silicon dioxide or a low dielectric constant (k) material such as those listed above with respect to the first insulator layer. The first and second insulator layer materials do not have to be the same material.

Figure 3D:
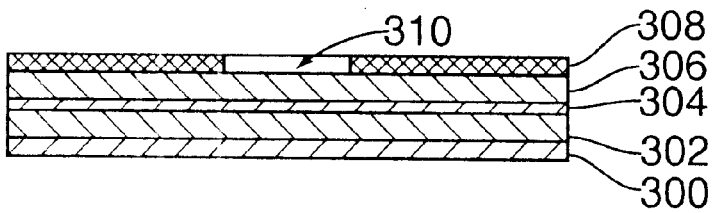

FIG. 3D depicts a photoresist deposited on top of the top surface of the second insulator layer 306 which has been developed and patterned to define an aperture 310. As such, the aperture 310 has a size and shape of the ultimate via that will be formed in the first insulator layer 302. The photoresist in this case is conventionally formed, developed and patterned.

Figure 3E:
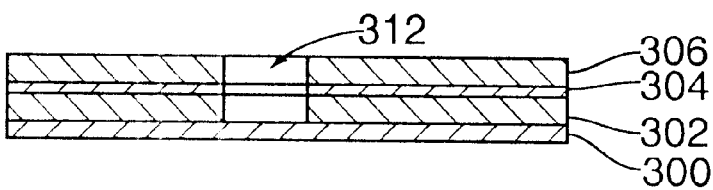

In FIG. 3E, all three layers; namely, the first insulator layer 302, the etch stop layer 304 and the second insulator layer 306, are etched sequentially in one process step using a conventional reactive ion etch process which forms a hole 312 through all three layers, i.e., the layers are etched in the following order layer 306, 304 and then 302. The hole is approximately the diameter of the ultimate via. Additionally, in FIG. 3E, the photoresist has been stripped after the etch process is complete. A conventional photoresist strip process generally is used, i.e., a dry ashing using an oxygen or oxygen-flourine chemistry followed by a wet chemical strip to remove residues. For low K materials that are adversely affected by oxygen (e.g., organic low K materials, HSQ, and the like), dry ashing is not used. In those instances a wet photoresist strip solution is used. The wet strip may be followed by a post ash wet chemistry residue clean process. Although a single etch step is described above, each layer, e.g., layers 306, 304, and 302, could be etched with individual etch processes that have etchant chemistries that are defined by the material of each layer.

Figure 3F:
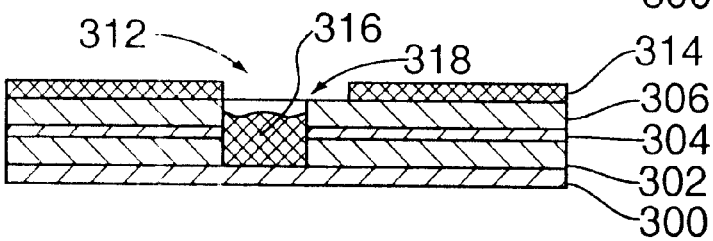

FIG. 3F depicts the structure after a photoresist has been spun on, or otherwise applied, to the top of the second insulator layer 306 and thereafter developed and patterned to define an aperture 318 trench. This aperture has the size and shape of the ultimate trench flat as to be formed in the second insulator layer. Note that the developing process for the trench mask does not remove all the photoresist from the hole 312, i.e., photoresist 316 remains in the hole 312. Consequently, during a subsequent etch process, the hole dimensions are not affected or changed by the etchant.

Figure 3G:
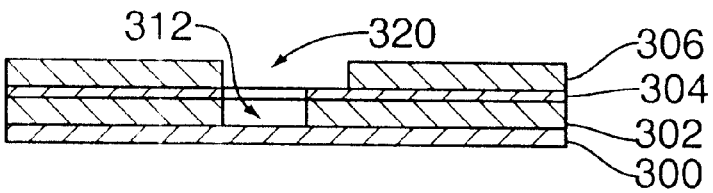
Figure 3H:
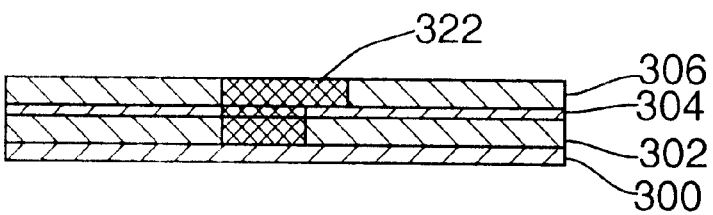

FIG. 3G depicts the structure after having had a trench 320 etched through the second insulator layer to the etch stop layer, i.e., the etch stop layer is conventionally used as an end point indicator in the etch process in a manner that is well known in the art. For a silicon dioxide insulator, the etch process uses a $C_xH_yF_z$-type chemistry. When using a low dielectric constant (k) material (e.g., k<3.8) in either insulator layer, the etch stop layers are generally silicon nitride or silicon dioxide. Additionally a hard mask is used as a top layer of the structure to ensure accurate via definition during etching. A comprehensive review of low k material use in multilevel metallization structures is described in commonly assigned U.S. patent application Ser. No. 08/987,219, filed Dec.9, 1997 and hereby incorporated herein by reference.

Once etching is complete, the remaining photoresist is stripped from the surface of the second insulator layer 306 as well as from within the hole 312. The structure of FIG. 3G is the conventionally metallized using aluminum, aluminum alloy, copper, copper alloy or other such metals. Metallization may be performed using chemical vapor deposition (CVD), physical vapor deposition (PVD), combination CVD/PVD, electroplating and electro-less plating. To complete a dual damascene interconnect structure 322, the metallized structure is planarized using chemical mechanical polishing (CMP) or an etch-back process to form the structure 322 depicted in FIG. 3H.

Using the process described above, a complete via is etched, since the via is formed before the trench. As such, alignment errors that have affected the via size in the prior art are of no consequence when using the process of the present invention. Furthermore, the trench width can be made the same as the via width enabling an increase in the density of devices fabricated within the integrated circuit.

The foregoing technique can be used to define and fabricate a multi-level interconnect structure. In essence, this process for producing a multi-layer interconnect structure is accomplished by repeating the foregoing dual damascene technique.

Figure 4A:
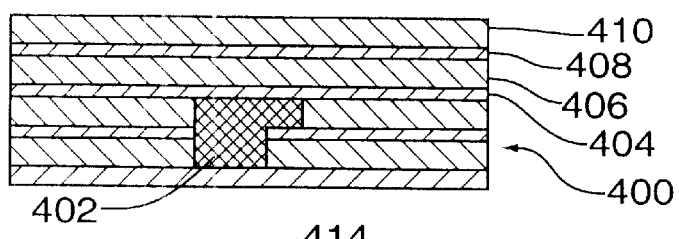
FIGS. 4A–4G depict the sequence of process steps that, when used in combination with the steps of FIGS. 3A–3H, form a multilevel interconnection structure.

FIGS. 4A through 4G depict the resultant structure after each process step for fabricating a multi-level structure in accordance with the present invention. FIG. 4A assumes that a first layer 400 has been completed as defined by FIGS. 3A–3H to form a first interconnect 402 (via and trench combination). Thereafter, FIG. 4A depicts the deposition of a passivation layer 404 (e.g., silicon nitride). Additionally, a third insulator layer 406, as well as an etch stop layer 408 and a fourth insulator 410, are then deposited atop of the passivation layer 404. The third insulator layer 406 is deposited to a thickness of approximately the desired depth of a second via. Deposition of the third insulator layer 406 is generally accomplished using a chemical vapor deposition (CVD) process. The etch stop layer 408, which is generally formed of silicon nitride, is deposited by a CVD processing. The fourth insulator layer 410 is similarly deposited by a CVD process to a thickness that approximates the ultimate trench depth.

Figure 4B:
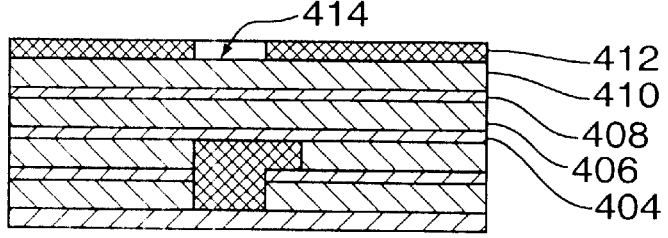

FIG. 4B depicts a photoresist 412 having been deposited, developed and patterned atop of the top surface of the fourth insulator layer 410. This photoresist will form the via mask. For example, the photoresist is spun on, developed and patterned to define an aperture 414 having the location and dimension of the ultimate via that is to be formed in the third insulator layer 406. Alternatively, the photoresist can be applied using a chemical vapor deposition process in lieu of a spin on process.

Figure 4C:
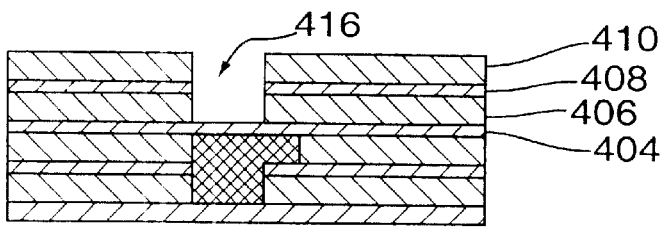

FIG. 4C depicts the structure after an etchant has etched through the fourth insulator layer 410, the etch stop layer 408 and the third insulator layer 406 using a $C_xH_yF_z$-based etch chemistry. Upon partially etching through the third insulator layer the etch chemistry is switched to an etch chemistry that is highly selective of the passivation layer 404 such that all three layers are etched which stops on the passivation layer 404. The hole 416 that is formed in this etch step is the size of the ultimate via that will be metallized in the third insulator layer 406. FIG. 4C depicts the structure after the photoresist that was used to define the via has been stripped from the structure.

Figure 4D:
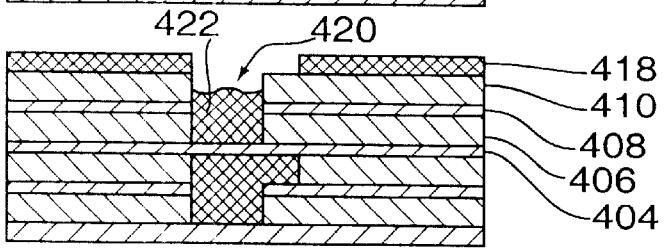

FIG. 4D depicts the structure after the photoresist 418, which has been developed and patterned to define an aperture 420, has been formed atop the fourth insulator layer 410. Note that some of the photoresist 422 may be deposited into via (hole 416) which protects the via and the passivation layer from being etched as the trench is etched in the fourth insulator layer 410. The photoresist is, for example, spun on (or otherwise deposited), developed and patterned to define the size and shape of the ultimate trench to be formed in the fourth insulator layer.

Figure 4E:
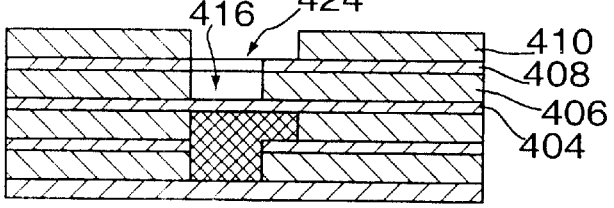

FIG. 4E depicts the structure after the trench etch has been performed to form the trench 424 in the fourth insulator layer 410 using a reactive ion etch process. FIG. 4E also depicts the structure after the undeveloped photoresist has been stripped from the structure.

Figure 4F:
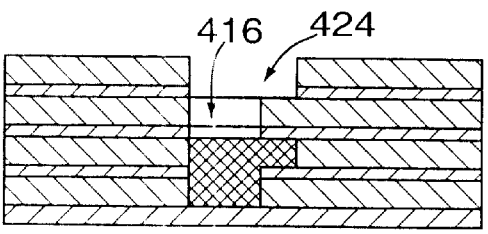

Lastly, as shown in FIG. 4F, the passivation layer 404 is etched within the via 416 and the third insulator layer 406 is opened up to form a connection location to the underlying interconnect structure 402 defined in the first interconnect layer 400. Although the foregoing description assumes that the etch stop layer and passivation layer are the same material and thickness. the etch stop and passivation layers need not be fabricated of the same material or be the same thickness. From the description herein, those skilled in the art will easily be able to modify the procedure to facilitate use of different materials and/or thicknesses of the etch stop and passivation layers.

Figure 4G:
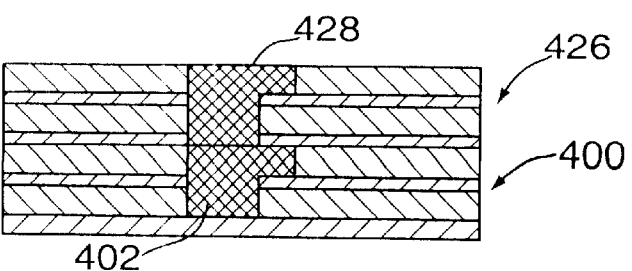

As shown in FIG. 4G, the second interconnect layer 426 can be metallized such that the second interconnect structure 428 can be conductively 404 connected to the lower interconnect structure 402. The metallized structure is then planarized using CMP or an etch-back process to result in the multilevel dual damascene structure of FIG. 4G.

In this process, there are two resist steps involved. The passivation layer 402 is deliberately not removed during via or trench etch so as to protect the underlying metal (e.g., copper) from resist strip processes. Since an oxygen-based plasma is typically used for such stripping, copper corrosion during resist strip or post etch residue removal, typically by wet chemistry, is a concern when copper is used for metallization.

Alternatively, the passivation layer can be removed while etching the via through the fourth insulation layer 410, etch stop layer 408 and the third insulator layer 406. In this case, to protect the copper from corrosion during resist strip processes, lower temperature resist strip processes can be used combined with a wet chemistry (for post-etch residue removal) that does not corrode copper. However, it is preferred that the passivation layer not be removed during the via and trench etch steps.

Figure 5:
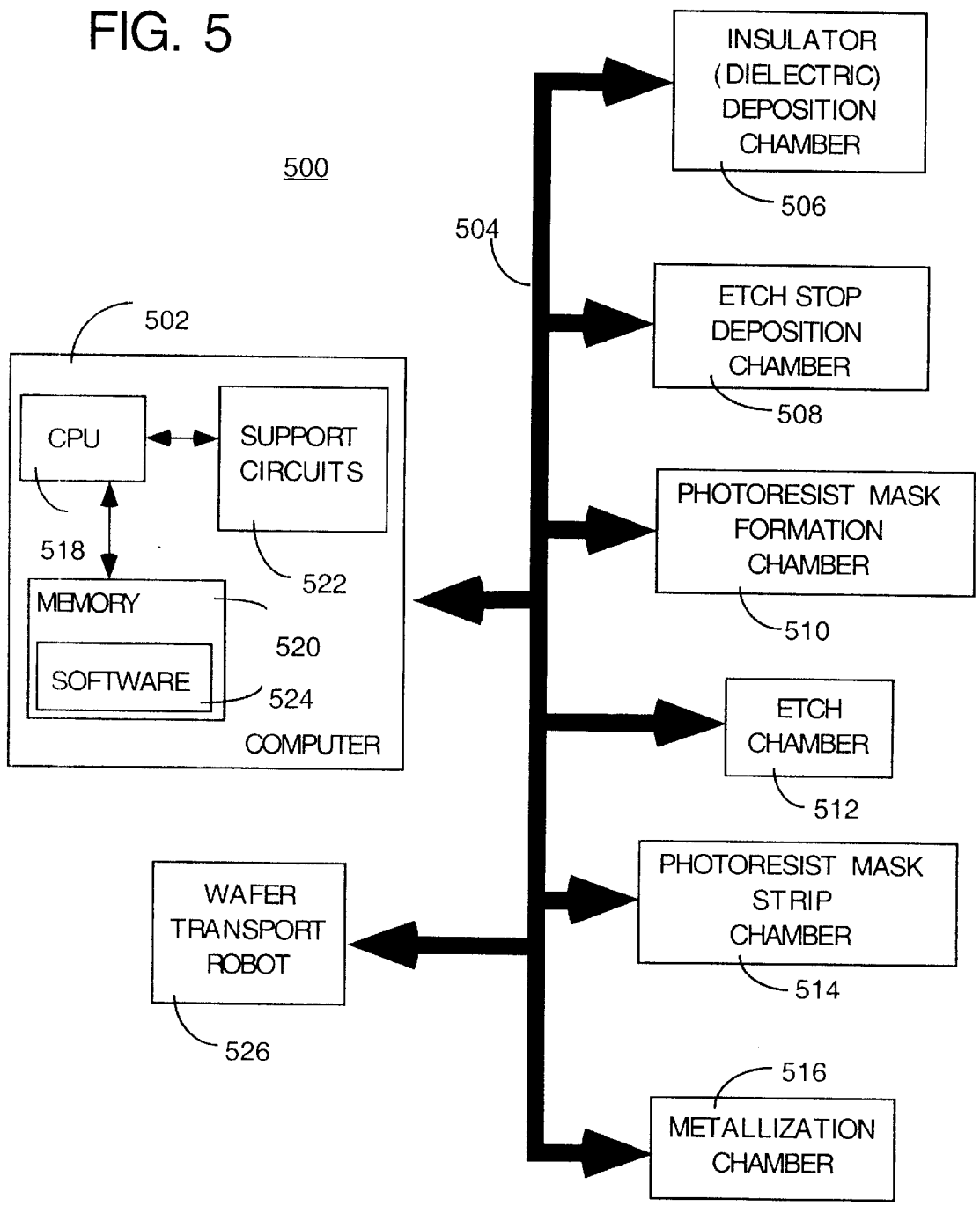
FIG. 5 depicts a block diagram of a computer controlled semiconductor wafer processing system used to fabricate the interconnect structure of the present invention.

FIG. 5 depicts a block diagram of a computer-controlled semiconductor wafer processing system 500 used to fabricate the interconnect structure of the present invention. The system 500 contains a computer system 502 that is coupled via a computer communications bus 504 to a plurality of chambers and subsystems for accomplishing various process steps upon a semiconductor wafer. These chambers and subsystems include an insulator (dielectric) deposition chamber 506, an etch stop deposition chamber 508, a photoresist mask formation chamber 510, an etch chamber 512, a photoresist strip chamber 514, and a metallization chamber 516. The computer system contains a central processing unit (CPU) 518, a memory 520, and various support circuits 522. The central processing unit 518 may be one of any form of general purpose computer processor that can be used in an industrial setting for controlling various chambers and subprocessors. The memory 520 is coupled to the central processing unit 518. The memory 520 may be one or more of readily available memory such as random access memory (RAM), read only memory (ROM), floppy disk, hard disk, or any other form of digital storage. The support circuits 522 are coupled to the central processing unit 518 for supporting the processor in a conventional manner. These circuits include cache, power supplies, clock circuits, input/output circuitry and subsystems, and the like. The control software that is used for implementing the fabrication steps of the present invention is generally stored in memory 520 as software routine 524. The software may also be stored and/or executed by a CPU that is remotely located from the hardware being controlled by the CPU.

When executed by the CPU 518, the software routine 524 transforms the general purpose computer 502 into a specific purpose computer that controls the various chambers such that fabrication steps are performed in each of the chambers. The specific process functions performed by the software routine 524 are discussed in detail with respect to FIG. 6 below.

Although a general purpose computer 502 that is programmed to become a specific purpose computer for controlling the semiconductor wafer processing system 500 is disclosed, it should be understood that the computing functions of the single general purpose computer 502 that is depicted may be distributed amongst the various chambers and subsystems and executed on processors that are related to those chambers and subsystems while the general purpose computer is merely used as a controller of the computers that are attached to each of the chambers and subsystems. In addition, although the process of the present invention is discussed as being implemented as a software routine, some of the method steps that are disclosed therein may be performed in hardware as well as by the software controller. As such, the invention may be implemented in software as executed upon a computer system, in hardware as an application specific integrated circuit or other type of hardware implementation, or a combination of software and hardware.

FIG. 6 depicts a flow diagram of the process steps that are contained within the semiconductor wafer processing system control routine 524. The routine 524 begins at step 600 by placing a wafer within the insulator (dielectric) deposition chamber wherein the insulator is deposited upon the wafer. At step 602, the routine causes the etch stop deposition chamber to deposit an etch stop layer upon the insulator layer. Generally, the insulator layer 600 and the etch stop layer 602 are deposited in two different types of semiconductor wafer processing chambers, and therefore, the controller will have to move the wafer from one chamber to another generally using a wafer transport robot. Alternatively, the insulator and etch stop layers can be deposited in a single chamber such that a wafer transfer step is avoided.

When separate chambers are used, the wafer is transported from the etch stop deposition chamber back to the insulator layer deposition chamber to deposit a second insulator layer on top of the etch stop layer. Thereafter, at step 606, the via photoresist is deposited and patterned to identified the locations for the vias. At step 608, the mask structure is then etched using an etch chamber to form the vias through the first and second insulator layer as well as through the etch stop layer. The wafer is then moved to a photoresist strip chamber where the photoresist is moved at step 610. Then, at step 612, the wafer is transported back to the photoresist mask formation chamber to have the trench photoresist mask formed and patterned atop of the via structure. The wafer containing the mask structure is transported to the etch chamber to etch, at step 614, the trench into the wafer. At step 616, the trench and via structure is metallized in a metallization chamber, usually by chemical vapor deposition (CVD), physical vapor deposition (PVD), a combination of CVD/PVD, electroplating, or electro-less plating of metallic material atop of the dual damascene structure. At step 618, the metallization is then planarized in a CMP machine or using an etch-back process within an etch chamber. As such, a dual damascene interconnect structure is formed in accordance with the present invention. If a multi-level structure is to be fabricated, the process of step 600 through 618 can be repeated using a passivation layer between the levels as discussed with respect to FIG. 4A through 4G above.

Although various embodiments which incorporate the teachings of the present invention have been shown and described in detail herein, those skilled in the art can readily devise many other varied embodiments that still incorporate these teachings.

What is claimed is:

1. A method of forming an interconnect structure comprising the steps of:

(a) depositing a first insulator layer upon a substrate;

(b) depositing an etch stop layer upon said first insulator layer;

(c) depositing a second insulator layer on top of said etch stop layer;

(d) forming a first mask atop of said second insulator layer;

(e) etching said first insulator layer, said etch stop layer and said second insulator layer in a single step to define a via;

(f) removing said first mask;

(g) forming a second mask to define a trench;

(h) etching said second insulator layer as defined by said second mask to form a trench; and (i) metalizing said via and said trench to form an interconnect structure.

2. The method of claim 1 wherein said first mask is formed by the following steps:

applying a photoresist material onto said second insulator layer;

developing said photoresist; and patterning said photoresist to define a location and dimension of said via.

3. The method of claim 1 wherein said etching step which forms said via is a reactive ion etch.

4. The method of claim 1 wherein said etch of said trench in the second insulator layer is a reactive ion etch.

5. The method of claim 1 wherein said first insulator layer and said second insulator layer are made of silicon dioxide.

6. The method of claim 1 wherein said first insulator layer or said second insulator layer or both are made of a low dielectric constant material.

7. The method of claim 1 further comprising forming a second level of interconnect structure containing a second via and a second trench by passivating said metallization and then repeating steps (a) through (h), then etching a passivation layer to expose said metallization at a bottom of said second via and metalizing said second via and trench.

8. The method of claim 1 wherein the etching performed in step (e) is conducted using one etch chemistry.

9. The method of claim 1 wherein said second mask is formed by following steps:

applying a photoresist material onto said second insulator layer;

developing said photoresist; and patterning said photoresist to define a location and dimension of said trench.

10. The method of claim 9 wherein the photoresist is not developed completely within said via.

11. A method of forming a multiple level interconnect structure comprising the steps of:
 (a) depositing a first insulator layer upon a substrate;
 (b) depositing an etch stop layer upon said first insulator layer;
 (c) depositing a second insulator layer on top of said etch stop layer;
 (d) forming a first mask atop of said second insulator layer;
 (e) etching said first insulator layer, said etch stop layer and said second insulator layer in a single step to define a via;
 (f) removing said first mask;
 (g) forming a second mask to define a trench;
 (h) etching said second insulator layer as defined by said second mask to form a trench;
 (i) metalizing said via and said trench to form an interconnect structure;
 (j) plagiarizing said metallization;
 (k) forming a passivation layer over said planarized metallization;
 (l) repeating steps (a)–(h) to form a second level of interconnect structure contains a second via and second trench;
 (m) removing said passivation layer at a bottom of said second via; and
 (n) metalizing said second via and said second trench to form a second layer for said interconnect structure.

12. The method of claim 10 wherein said first mask is formed by the following steps:
 applying a photoresist material onto said second insulator layer;
 developing said photoresist; and
 patterning said photoresist to define a location and dimension of said via.

13. The method of claim 11 wherein said etching step which forms said via is a combination of a reactive ion etch and an isotropic etch.

14. The method of claim 11 wherein said etch of said trench in the second insulator layer is a reactive ion etch.

15. The method of claim 11 wherein said first insulator layer and said second insulator layer are made of silicon dioxide.

16. The method of claim 11 wherein said first insulator layer or said second insulator layer or both are made of a low dielectric constant material.

17. The method of claim 11 wherein the etching performed in step (e) is conducted using one etch chemistry.

18. The method of claim 11 wherein said second mask is formed by the following steps:
 applying a photoresist material onto said second insulator layer;
 developing said photoresist; and
 patterning said photoresist to define a location and dimension of said trench.

19. The method of claim 18 wherein the photoresist is not developed completely within said via.

* * * * *

UNITED STATES PATENT AND TRADEMARK OFFICE
CERTIFICATE OF CORRECTION

PATENT NO. : 6,245,662 B1
DATED : June 12, 2001
INVENTOR(S) : Naik et al.

It is certified that error appears in the above-identified patent and that said Letters Patent is hereby corrected as shown below:

<u>Column 10, claim 12,</u>
Line 1, please replace "claim 10" with -- claim 11 --.

Signed and Sealed this

Twenty-sixth Day of February, 2002

*Attest:*

*Attesting Officer*

JAMES E. ROGAN
*Director of the United States Patent and Trademark Office*